(12) United States Patent
Henson et al.

(10) Patent No.: US 6,969,657 B2
(45) Date of Patent: Nov. 29, 2005

(54) SUPERJUNCTION DEVICE AND METHOD OF MANUFACTURE THEREFOR

(75) Inventors: Timothy Henson, Torrance, CA (US); Jianjun Cao, Torrance, CA (US); Kyle Spring, Temecula, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/808,049

(22) Filed: Mar. 24, 2004

(65) Prior Publication Data

US 2004/0224455 A1 Nov. 11, 2004

Related U.S. Application Data

(60) Provisional application No. 60/457,640, filed on Mar. 25, 2003.

(51) Int. Cl.[7] ............................................... H01L 21/336
(52) U.S. Cl. .......................... 438/268; 438/234; 257/328
(58) Field of Search .................................. 438/268, 234, 438/209, 270–275, 286–289; 257/341–339, 328

(56) References Cited

U.S. PATENT DOCUMENTS 6,586,798 B1 * 7/2003 Frisina ........................ 257/328
6,639,276 B2   10/2003 Spring et al.

* cited by examiner

*Primary Examiner*—Dung A. Le
(74) *Attorney, Agent, or Firm*—Ostrolenk, Faber, Gerb & Soffen, LLP

(57) ABSTRACT

A process for forming a superjunction device that includes a series of implants to form closely spaced implant regions which are linked together by a short thermal step, whereby deep and narrow regions can be formed within a semiconductor body.

12 Claims, 4 Drawing Sheets

SUPERJUNCTION DEVICE AND METHOD OF MANUFACTURE THEREFOR

RELATED APPLICATION

This application is based on and claims benefit of U.S. Provisional Application No. 60/457,640, filed on Mar. 25, 2003, entitled Superjunction Device and Method of Manufacture Therefore, to which a claim of priority is hereby made.

FIELD OF THE INVENTION

This invention relates to MOSgated devices and more specifically relates to a superjunction device and method for its manufacture.

BACKGROUND OF THE INVENTION

A well known and prevalently used power semiconductor device is a power MOSFET. FIG. 1 shows a cross-sectional view of a portion of the active region of a power MOSFET according to prior art. The device illustrated by FIG. 1 is of the trench variety. A trench type power MOSFET includes vertical gate structures.

FIG. 2 shows the cross-sectional view of a portion of the active region of a prior art power MOSFET. The device illustrated by FIG. 2 is a planar type device. Such devices include horizontally oriented gate structures.

Referring now to both FIGS. 1 and 2, each device includes source regions 10 each formed in a channel region 12. Gate structures are formed adjacent source regions 10 and the channel region 12 in which the source regions 10 are formed. Each gate structure includes a gate electrode 14, which is typically formed from a conductive polysilicon, and a gate insulation layer 16 which is typically comprised of silicon dioxide. Each gate insulation layer 16 insulates its associated gate electrode 14 from an adjacent channel region 12.

As is well known in the art, in a vertical conduction type MOSFET, channel region 12 is disposed adjacent to drift region 18. Drift region 18 and source regions 10 are of one conductivity while channel region 12 is of the opposite conductivity. Thus, under a range of applied voltages, source regions 10 and drift region 18 are insulated from one another by channel region 12. When an appropriate voltage is applied to a gate electrode 14 a region (invertible channel region or channel) in channel region 12 adjacent its associated gate insulation layer 16 changes conductivity through what is referred to as inversion. As a result, source regions 10 and drift region 18 become electrically connected. Thus, current can be conducted when a voltage is applied between source regions 10 and drift region 18.

In a typical power MOSFET, drain region 18 is epitaxially formed over a semiconductor substrate 20 of the same conductivity, but of a higher concentration of dopants. To allow for external electrical connection drain contact 22 may be electrically connected to substrate 20, and source contact 24 may be electrically connected to source regions 10. It is also well known to connect source contact 24 to a high conductivity contact region 26 of the same conductivity as channel region 12 in order to suppress the possibility of formation of parasitic devices.

FIGS. 1 and 2 show an N channel device in which source regions 10 and drift region 18 have N type conductivity, while channel region 12 has P type conductivity. These conductivity types may be reversed in order to obtain a P channel device.

In a power MOSFET, it is desirable to reduce the resistance of the device during conduction (Rdson). Rdson is primarily determined by the resistance of the channel and the resistance of drift region 18. The resistivity of the drift region is determined by the resistivity and thickness of the epitaxial layer, and is proportional to the breakdown voltage rating of the device. The breakdown voltage rating of the device indicates the ability of the device to withstand breakdown under reverse voltage conditions. Thus, to reduce Rdson the conductivity of the epitaxial layer can be increased, which adversely affects the breakdown voltage rating of the device. Conversely, to improve the breakdown voltage rating the conductivity of the epitaxial layer can be reduced, which increases Rdson. The inverse relationship between Rdson and breakdown voltage rating often forces designers to settle for less than ideal values for the Rdson and the breakdown voltage rating of a device.

A superjunction structure allows the designers to decrease the Rdson of a device without adversely affecting its breakdown voltage. A conventional superjunction device includes alternating P and N type regions below the active cells of the device. The alternating P and N type regions are in substantial charge balance so that under a reverse voltage condition these regions deplete one another thereby allowing the device to withstand breakdown. Thus, a superjunction arrangement allows for an increase in the conductivity of the drain region to improve the Rdson without an affect on the breakdown voltage rating of the device.

FIG. 2 shows a device that includes a superjunction type arrangement. Specifically, FIG. 2 shows a planar type power MOSFET which includes regions 28 of conductivity opposite to that of drift region 18. Regions 28 are in substantial charge balance with drift region 18 in order to form a superjunction.

In a superjunction device of a given breakdown voltage, it is known that Rdson per unit area is reduced as the width (Wp) of regions 28 is reduced. Table 1 is an example of the relationship between $R_{dson}$ and the width of regions 28. The data show, for example, that at 200 V a device with W(p)= 1.5 um has 71% lower $R_{dson}$ than a device with W(p)=6 um.

TABLE 1

| V | Width W(p) (um) | Pitch (um) | Epi Thickness (um) | Epi Resistivity ohm-cm | Drift R*A mohm-mm^2 | % lower R*A than 12 um pitch |
|---|---|---|---|---|---|---|
| 200 | 6 | 12 | 13.8 | 1.15 | 319 | |
| 200 | 4 | 8 | 13.8 | 0.79 | 219 | 31% |
| 200 | 3 | 6 | 13.8 | 0.61 | 169 | 47% |
| 200 | 2 | 4 | 13.8 | 0.42 | 117 | 63% |
| 200 | 1.5 | 3 | 13.8 | 0.33 | 92 | 71% |

Thus, for a device such as the one shown in FIG. 2, it is desirable to reduce the pitch (the cell to cell spacing defined by the distance between the center of adjacent trenches).

In a device shown in FIG. 2, a first epitaxial silicon layer 18' of about 5–10 um and a first conductivity (e.g. N-type) is grown on a silicon substrate 20 of the same conductivity but higher concentration. First epitaxial silicon 18' is then masked. The mask includes windows that expose portions of first epitaxial silicon 18' to receive an implant of a second conductivity (e.g. P type) at an energy of about 120 keV. Optionally, the implant is then thermally activated after the masking material is removed.

Next, a second epitaxial silicon 18" layer is grown on top of first epitaxial silicon 18' layer. Second epitaxial silicon 18" is also masked and implanted similar to first epitaxial silicon 18". If desired third epitaxial silicon 18''' may be formed, masked and implanted similar to first epitaxial silicon 18' and second epitaxial silicon 18". The process may be repeated until a drift region 18 of desired thickness is obtained. Thereafter, a diffusion drive is applied to merge the implants in the vertical direction so that region 28 is formed.

A process for forming a device as shown in FIG. 2 results not only in driving the implants in the vertical direction, but also driving the implants in the horizontal direction. As a result of the process described above, the width of regions 28 is typically greater than 5 um. Consequently, the pitch of a device produced using the above-described process is high. Wide regions 28 are suitable for high voltage devices, but not suitable for low voltage devices due to unacceptably high Rdson.

Other methods have also been suggested for forming superjunction devices. For example, it has been suggested that regions 28 in the device of FIG. 2 can be formed by etching a groove and filling the same with p-type material through, for example, epitaxial deposition. Such a process, however, involves a complicated deep trench etch process, which cannot create the narrow pitch device that is desired. The epitaxial growth process in the trench also introduces defects and can possibly compromise the reliability of the device.

Another suggested method is forming regions 28 through selective neutron transmutation doping. This process, however, is not commonly used or available for power MOSFET fabrication.

Yet another suggested method involves forming a deep trench, doping the sidewalls of the trench to form regions 28, and then filling the trench with a dielectric material. This process can possibly provide narrow pitch devices, but still requires deep trenches to be etched in the silicon, and the sidewalls to be doped in a defined manner. It is doubtful that this doping can be controlled well.

SUMMARY OF THE INVENTION

According to the present invention, to form a superjunction device, regions of second conductivity are formed in the drift region through a series of implants that result in closely-spaced and vertically adjacent implant regions. The implant regions are then driven in a short diffusion drive in order to link up and form vertically oriented regions of second conductivity that are in charge balance with the drift region to form a superjunction device. The spacing between the vertically adjacent implant regions can be controlled and kept small so that only a short diffusion drive will become necessary to link up the implant regions to form vertically oriented regions of second conductivity in the drift region of the device. As a result, the width of the vertically oriented regions of second conductivity can be kept close to the width of the implant windows through which implant regions are formed. Therefore, a process according to the present invention allows for great control over the width of the vertically oriented regions of second conductivity, which in turn allows for the manufacture of narrow columns of second conductivity in the drift region, resulting in a device having a smaller pitch. A superjunction device with higher breakdown and lower Rdson can, therefore, be manufactured which is suitable for low voltage applications.

DETAILED DESCRIPTION OF THE DRAWINGS

Figure 1:
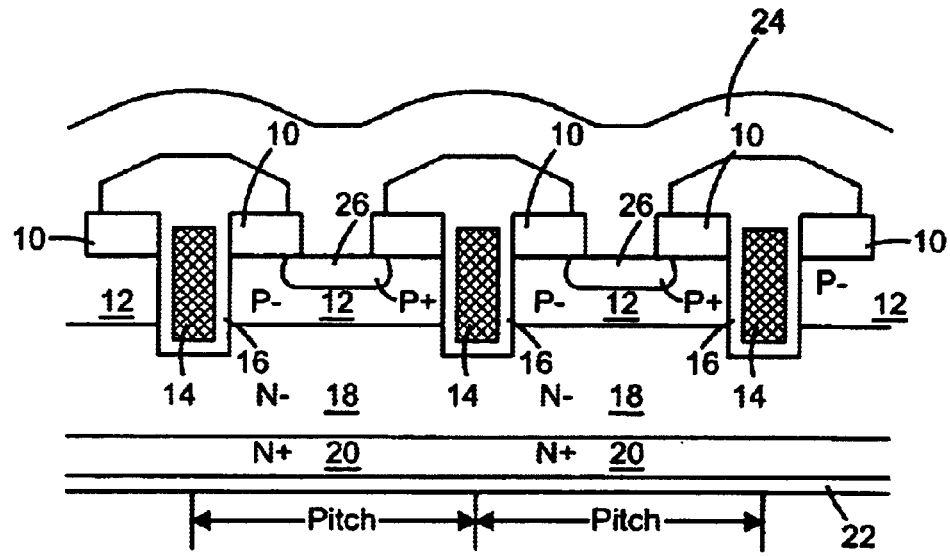
FIG. 1 is a schematic cross-section of a portion of a prior art trench power MOSFET.
Figure 2:
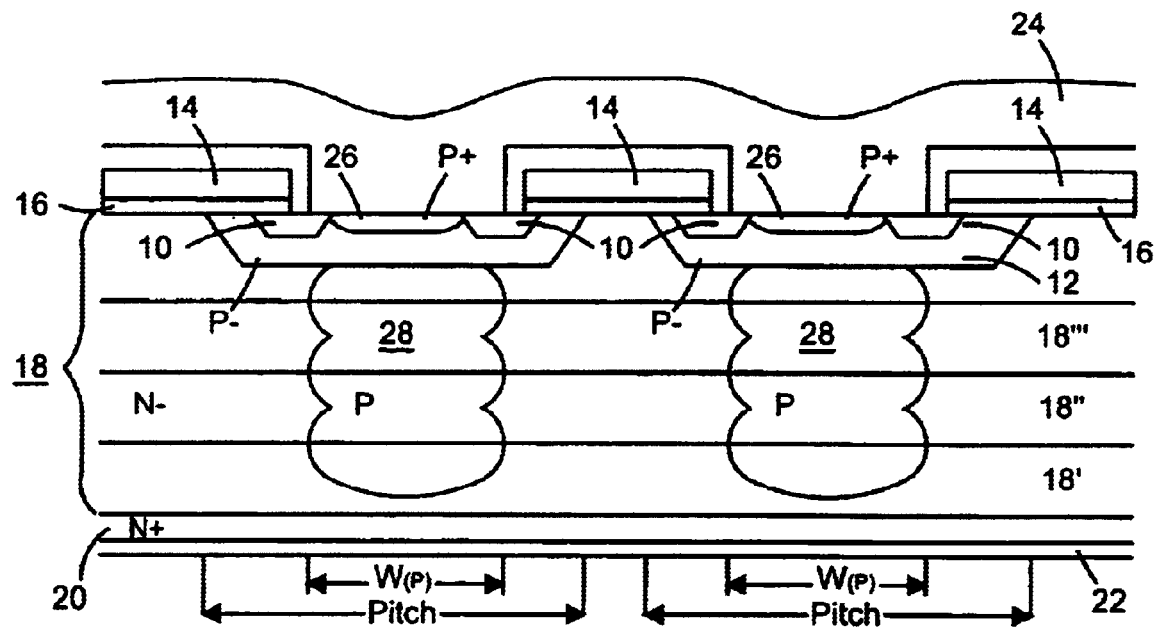
FIG. 2 is a schematic cross-section of a portion of a prior art superjunction type power MOSFET.
Figure 3:
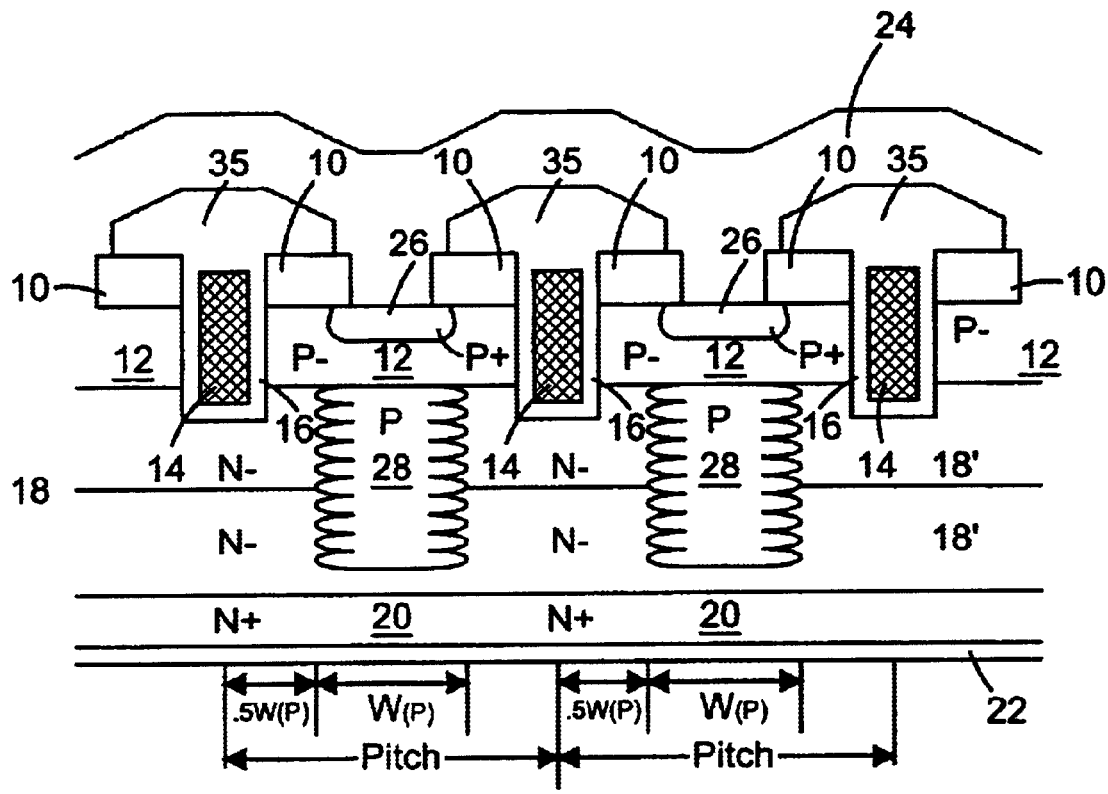
FIG. 3 schematically shows a cross-sectional view of a portion of a MOSgated device that is produced according to the present invention.

Referring now to FIG. 3, in which like numerals identify like features, a superjunction type power MOSFET produced according to the present invention includes regions 28. Regions 28 are disposed under channel region 12 in drift region 18, and are less than 5 um wide. Consequently, a power MOSFET according to the present invention has a small pitch and acceptably low Rdson suitable for low voltage applications.

Regions 28 in a MOSFET according to the present invention are formed using multiple high-energy, low-dose implants of a conductivity opposite to that of drift region 18. A suitable implant for an N type drift region 18, for example, may be boron (either $B^+$, or $B^{++}$, or $B^{+++}$), which is a P type dopant.

FIGS. 4a to 4e illustrate the process for the manufacture of a MOSFET according to the present invention.

Figure 4A:
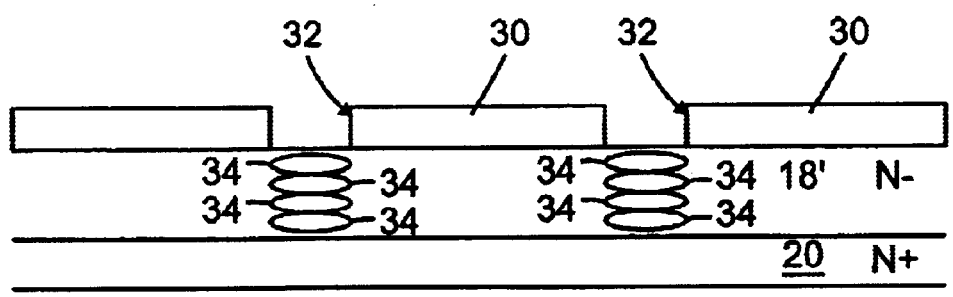
FIGS. 4a to 4e schematically illustrate steps according to the present invention.

Referring first to FIG. 4a, a first epitaxial silicon 18' layer of a first conductivity (e.g. N type) is grown on a silicon substrate 20 of the first conductivity. The thickness and resistivity of first epitaxial silicon 18' layer may be chosen according to the desired breakdown voltage of the device, as well as the depth of the implants for forming regions 28. In the preferred embodiment of the present invention, the thickness of first epitaxial silicon layer 18' may be 1–6 µm.

Thereafter, a mask 30 is formed over first epitaxial silicon 18' layer. Mask 30 is formed from a material which is capable of blocking a high energy implant, and includes implant windows 32 which expose the top surface of regions in epitaxial silicon 18' that are to receive implants of a second conductivity (e.g. P type). A suitable material for forming mask 30 may be a photoresist, an oxide, a nitride, or a combination thereof.

The width of implant windows 32 can be selected according to the desired breakdown voltage, and the depth of the implants received therethrough. It is preferred to have the width of the implant windows 32 to be between 0.25–2.0 µm. Implant windows 32 may be stripes or cellular, for example, hexagonal.

Next, a series of high energy boron implants are performed in first epitaxial silicon 18'. Each implant in the series of implants is at a different energy, and optionally different dose, whereby each results in an implant region 34 at least vertically adjacent to another implant region 34. The implant energies and doses are selected according to the desired breakdown voltage and desired cell pitch.

To perform the series of implants a high energy implanter may be employed. High energy implanters can typically implant boron with energies of 10 keV to 3.0 MeV, to a depth of up to 4 microns. Typical values of doses for each implant in the series of implants may range from 1E11 to 1E13 ions/cm$^2$.

As a result of multiple implants narrow but deep zones (each zone including a stack of vertically adjacent implant regions 34) of the second conductivity are formed in first epitaxial silicon 18' which extend from near the top surface thereof to near its bottom surface which is adjacent silicon substrate 20. Thereafter, mask 30 is removed.

Figure 4B:
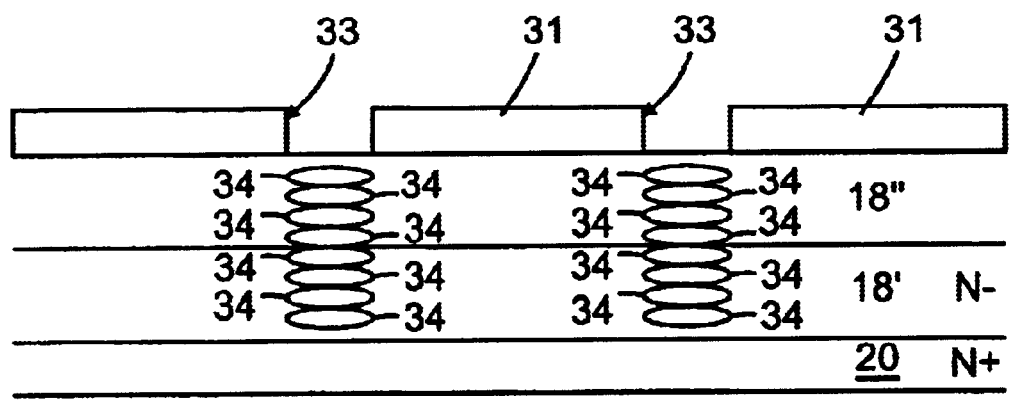

In a first embodiment of the present invention, after mask 30 is removed, second epitaxial silicon 18" layer is grown over first epitaxial silicon 18' layer as shown in FIG. 4b. The thickness and resistivity of second epitaxial 18" layer can be selected according to the desired breakdown voltage and the depth of implants received therein. Second epitaxial silicon 18" is also covered with mask 31 which is capable of blocking high energy implants. It should be noted that implant windows 33 in mask 31 are aligned with implant regions 34 in first epitaxial silicon 18' layer.

Thereafter, a series of high energy boron implants are performed to form a plurality of vertically adjacent implant regions 34 in second epitaxial silicon 18" layer above implant regions 34 in first epitaxial silicon 18' layer. Mask 31 is then removed, and a diffusion drive is applied to drive the implants whereby implant regions 34 join to form regions 28 in drift region 18. As a result of the present invention, implant regions 34 can be spaced closely to form narrow, but deep regions 28, which desirably improve the breakdown voltage and the Rdson of the MOSFET.

Figure 4C:
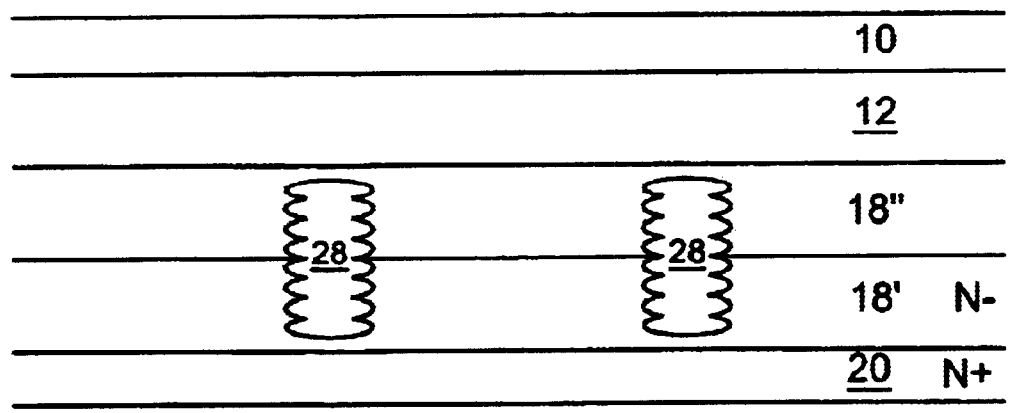

Referring now to FIG. 4C, a third epitaxial silicon layer of the second conductivity (e.g. P type) is grown with the appropriate dopant concentration to form channel region 12. Dopants of the first conductivity are then implanted into channel region 12, and driven in a diffusion drive to a desired depth to form source region 10.

Alternatively, channel region 12 is formed by the appropriate implantation of dopants of the second conductivity into second epitaxial silicon 18" followed by a diffusion drive to form channel region 12. Source region 10 can be formed as previously described or by any other method commonly used in power MOSFET fabrication.

Figure 4D:
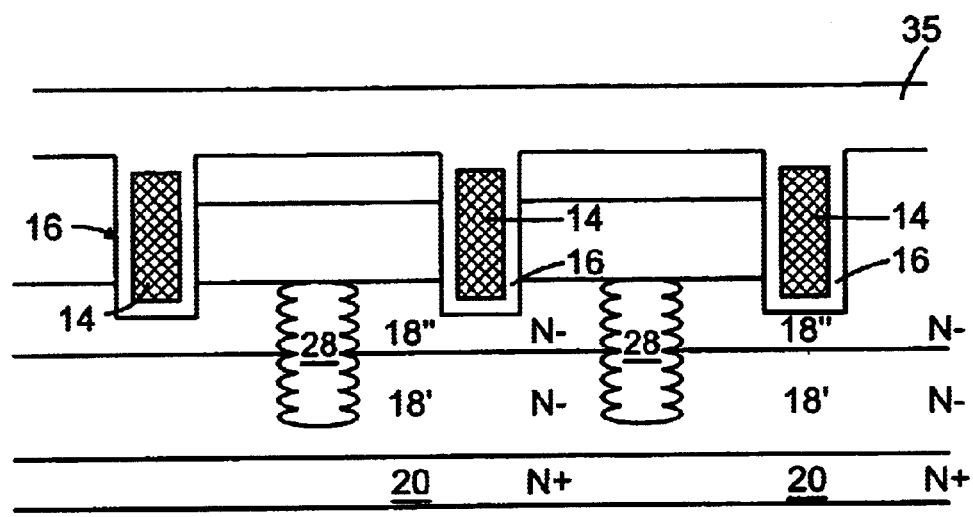

Thereafter, trenches may be formed employing any known trench forming process as shown in FIG. 4d. The formation of trenches is followed by gate oxidation to form gate oxide 16, followed by deposition of conductive polysilicon in the trenches. Next, the polysilicon is etched to form gate electrodes 14 in any conventional manner, and a low temperature oxide 35 is formed.

Figure 4E:
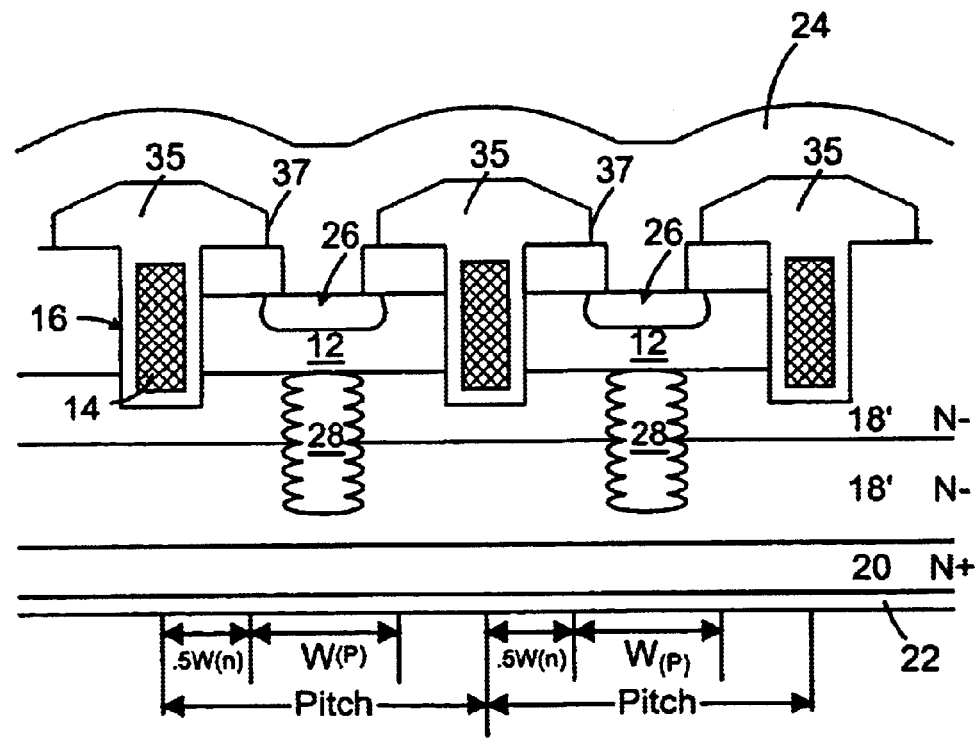

Referring next to FIG. 4e, windows 37 are opened in low temperature oxide 35 through an appropriate etching step to expose the silicon below. Thereafter, a recess 38 is formed in the silicon at the bottom of each window 37 to reach channel region 12. Next, dopants of the second conductivity type are implanted in channel region 12 at the bottom of each recess 38 to form high conductivity contact regions 26. A source contact 24 and drain contact 22 are then formed to complete a MOSFET according to the present invention.

It should be noted that two epitaxial silicon layers are not necessary for forming a device according to the present invention. For example, for a lower voltage device it may be possible to only have first epitaxial layer 18' before channel region 12 is formed. Furthermore, more than two epitaxial silicon layers may be formed and processed according to the present invention if a device of higher voltage is desired.

The above description is for an N-type trench MOSFET. The implant species may be reversed for a P-type trench MOSFET.

Furthermore, once deep and narrow regions 28 are formed using a process according to the present invention, any conventional MOSFET, including a planar MOSFET, may be formed to include the benefits of the present invention.

Although the present invention has been described in relation to particular embodiments thereof, many other variations and modifications and other uses will become apparent to those skilled in the art. It is preferred, therefore, that the present invention be limited not by the specific disclosure herein.

We claim:

1. A process for manufacturing a power device comprising:

providing a semiconductor substrate;

growing epitaxially a first semiconductor layer of a first conductivity on said semiconductor substrate;

forming a mask over a free surface of said first semiconductor layer, said mask including a plurality of windows exposing portions of said semiconductor layer, and being capable of blocking implants;

performing a series of implants through said implant windows to form a plurality of vertically adjacent regions of a second conductivity in said first semiconductor layer below said implant windows; and applying a diffusion drive to link said regions of said second conductivity to form vertically oriented regions of said second conductivity in said first semiconductor layer;

growing epitaxially a second semiconductor layer of said first conductivity over said first semiconductor layer of said first conductivity;

forming a second mask over a free surface of said second semiconductor layer, said second mask including a plurality of windows exposing portions of said second semiconductor layer, and being capable of blocking implants; and performing a series of implants through said implant windows in said second mask to form a plurality of vertically adjacent regions of said second conductivity in said second semiconductor layer below said implant windows and above said vertically oriented regions of said second conductivity in said first semiconductor layer;

forming a channel region of said second conductivity above said second semiconductor layer;

forming a plurality of MOS-gated structures through said channel region;

forming conductive regions of said first conductivity adjacent each MOS-gated structure;

forming a first electrical contact on said substrate; and forming a second electrical contact in electrical contact with at least said conductive regions of said first conductivity;

wherein said vertically oriented regions of said second conductivity are in substantial charge balance with said first and said second semiconductor layers.

2. A process according to claim 1, wherein said implant windows are 0.25 to 2.0 microns wide.

3. A process according to claim 1, wherein said vertically oriented regions of said second conductivity are less than 5 microns wide.

4. A process according to claim 1, wherein said channel region is formed by growing an epitaxial semiconductor layer of said second conductivity.

5. A process according to claim 1, wherein said channel region is formed by implanting dopants of said second conductivity into said epitaxial semiconductor layer.

6. A process according to claim 1, wherein said conductive regions of said first conductivity are source regions.

7. A process according to claim 1, wherein said first electrical contact is a drain contact, and said second electrical contact is a source contact.

8. A process according to claim 1, wherein said semiconductor substrate is of first conductivity.

9. A process according to claim 1, wherein said mask is comprised of an oxide.

10. A process according to claim 1, wherein said mask is comprised of photoresist.

11. A process according to claim 1, wherein said mask is comprised of a nitride.

12. A process according to claim 1, wherein said growing of an epitaxial semiconductor layer, said forming a mask, said performing a series of implants and said applying a diffusion drive are repeated more than two times.

* * * * *